(12) United States Patent
Okamoto

(10) Patent No.: US 10,884,082 B2
(45) Date of Patent: Jan. 5, 2021

(54) MAGNETIC RESONANCE IMAGING APPARATUS

(71) Applicant: CANON MEDICAL SYSTEMS CORPORATION, Otawara (JP)

(72) Inventor: Kazuya Okamoto, Saitama (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 41 days.

(21) Appl. No.: 16/451,059

(22) Filed: Jun. 25, 2019

(65) Prior Publication Data

US 2020/0003854 A1     Jan. 2, 2020

(30) Foreign Application Priority Data

Jun. 28, 2018   (JP) ................... 2018-122758

(51) Int. Cl.
*G01R 33/36*     (2006.01)
*G01R 33/3415*   (2006.01)

(52) U.S. Cl.
CPC ..... *G01R 33/3628* (2013.01); *G01R 33/3415* (2013.01); *G01R 33/3614* (2013.01)

(58) Field of Classification Search
CPC ............ G01R 33/3415; G01R 33/3614; G01R 33/3628
See application file for complete search history.

(56) References Cited

U.S. PATENT DOCUMENTS

| 2015/0115954 A1* | 4/2015 | Song ................. G01R 33/3607 324/303 |
| 2016/0135711 A1 | 5/2016 | Dohata et al. |
| 2018/0088193 A1* | 3/2018 | Rearick ............. G01R 33/3628 |
| 2018/0252783 A1* | 9/2018 | Jones ................ G01R 33/3635 |

FOREIGN PATENT DOCUMENTS

WO    2014/208501 A1    12/2014

OTHER PUBLICATIONS

Schmitt, M, et al. "$B_1$—Homogenization in abdominal imaging at 3T by means of coupling coils", Proc. Intl. Soc. Mag. Reson. Med. 13, 2005, p. 331.

* cited by examiner

*Primary Examiner* — Gregory H Curran
(74) *Attorney, Agent, or Firm* — Oblon, McClelland, Maier & Neustadt, L.L.P.

(57) ABSTRACT

A magnetic resonance imaging apparatus according to an embodiment includes a receiver array coil structured with a plurality of receiver coils. Each of the receiver coils included in the receiver array coil includes a coil element, a first tuning element configured to tune a tunable frequency of the receiver coil to a desired frequency, and a series circuit including a switching element and a second tuning element and being connected in parallel with the first tuning element. The switching element is configured to disconnect the first tuning element and the second tuning element from each other at the time of transmitting and is configured to arrange the first tuning element and the second tuning element to be electrically conductive with each other at the time of receiving. At least two receiver coils positioned adjacent to each other among the plurality of receiver coils are decoupled from each other.

6 Claims, 7 Drawing Sheets

MAGNETIC RESONANCE IMAGING APPARATUS

CROSS-REFERENCE TO RELATED APPLICATIONS

This application is based upon and claims the benefit of priority from Japanese Patent Application No. 2018-122758, filed on Jun. 28, 2018; the entire contents of which are incorporated herein by reference.

FIELD

Embodiments described herein relate generally to a magnetic resonance imaging apparatus.

BACKGROUND

Conventionally, magnetic resonance imaging apparatuses are apparatuses configured to apply a radio frequency magnetic field to an examined subject placed in a static magnetic field and to generate an image of the inside of the examined subject on the basis of magnetic resonance signals occurring from the examined subject due to an influence of the radio frequency magnetic field. As a radio frequency coil used for receiving the magnetic resonance signals occurring from the examined subject in such magnetic resonance imaging apparatuses, an array coil structured with a plurality of coils is known.

DETAILED DESCRIPTION

A magnetic resonance imaging apparatus according to an embodiment includes a receiver array coil structured with a plurality of receiver coils. Each of the receiver coils included in the receiver array coil includes a coil element, a first tuning element configured to tune a tunable frequency of the receiver coil to a desired frequency, and a series circuit including a switching element and a second tuning element and being connected in parallel with the first tuning element. The switching element is configured to disconnect the first tuning element and the second tuning element from each other at the time of transmitting and is configured to arrange the first tuning element and the second tuning element to be electrically conductive with each other at the time of receiving. At least two receiver coils positioned adjacent to each other among the plurality of receiver coils are decoupled from each other.

Exemplary embodiments of a magnetic resonance imaging apparatus will be explained in detail below, with reference to the accompanying drawings.

First Embodiment

Figure 1:
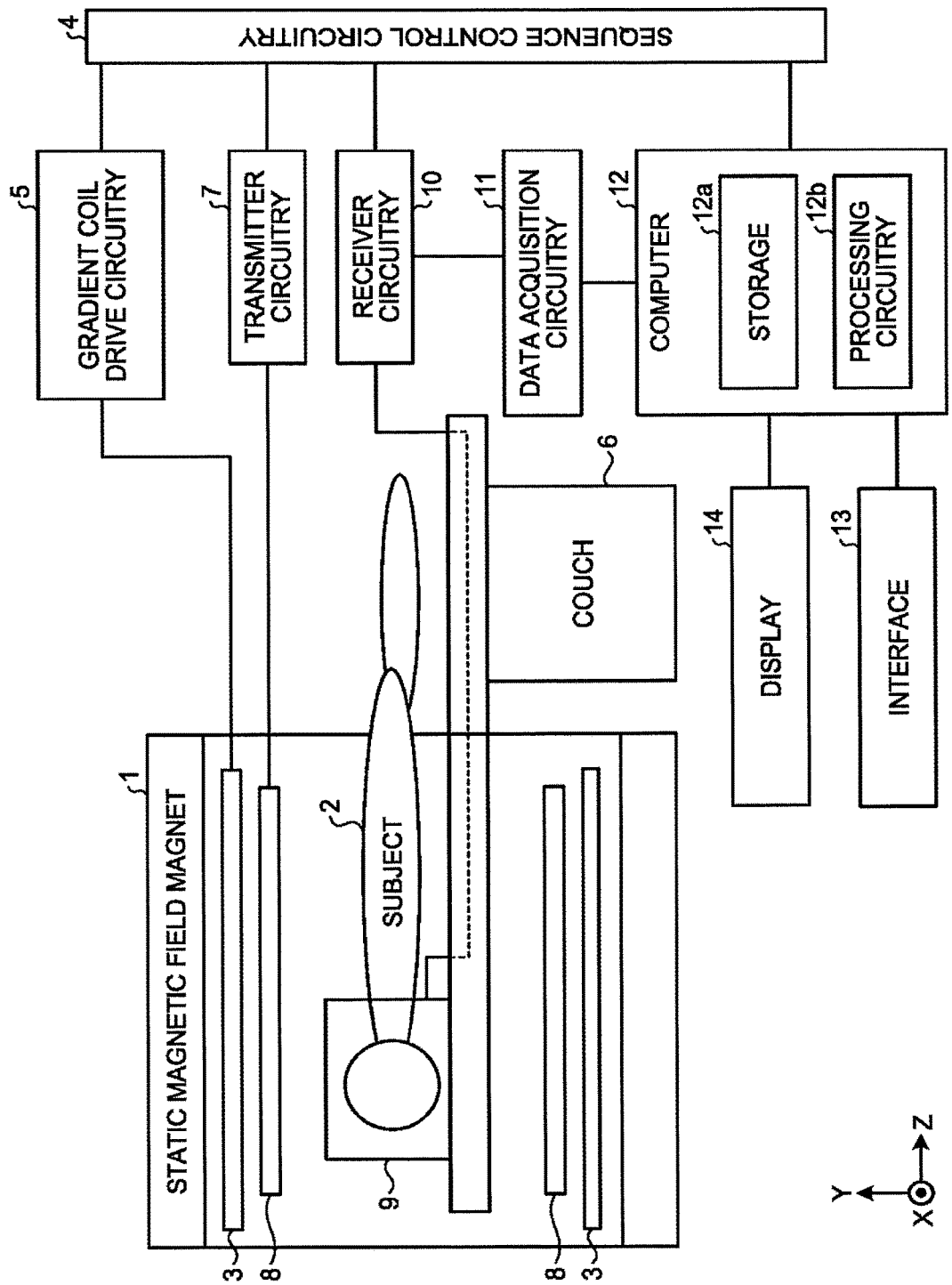
FIG. 1 is a diagram illustrating an exemplary configuration of a magnetic resonance imaging apparatus according to a first embodiment.

FIG. 1 is a diagram illustrating an exemplary configuration of a magnetic resonance imaging apparatus according to a first embodiment.

For example, as illustrated in FIG. 1, a Magnetic Resonance Imaging (MRI) apparatus 100 according to the present embodiment includes a static magnetic field magnet 1, a gradient coil 3, sequence control circuitry 4, gradient coil drive circuitry 5, a couch 6, transmitter circuitry 7, a transmitter coil 8, a receiver array coil 9, receiver circuitry 10, data acquisition circuitry 11, a computer 12, an interface 13, and a display 14.

The static magnetic field magnet 1, the gradient coil 3, and the transmitter coil 8 are each formed to have a hollow and substantially circular cylindrical shape (which may have an oval cross-section orthogonal to the central axis thereof) and are fixed to a gantry (not illustrated) while the gradient coil 3 is arranged on the inside of the static magnetic field magnet 1, and the transmitter coil 8 is arranged on the inside of the gradient coil 3. In this situation, the space formed on the inside of the transmitter coil 8 serves as an imaging area in which a subject 2 is placed at the time of an imaging data acquisition.

The static magnetic field magnet 1 is configured to generate a static magnetic field in the imaging area in which the subject 2 is placed. More specifically, the static magnetic field magnet 1 is configured to generate the static magnetic field in the imaging area positioned on the inside thereof. For example, the static magnetic field magnet 1 includes a cooling container formed to have a substantially circular cylindrical shape and a magnet such as a superconductive magnet that is immersed in a cooling member (e.g., liquid helium) filling the cooling container. Alternatively, for example, the static magnetic field magnet 1 may be configured to generate the static magnetic field by using a permanent magnet.

The gradient coil 3 is arranged on the inside of the static magnetic field magnet 1 and is configured to generate gradient magnetic fields in the imaging area in which the subject 2 is placed. More specifically, the gradient coil 3 is configured to generate the gradient magnetic fields that linearly change along the axial directions of X-, Y-, and Z-axes that are orthogonal to one another, within the imaging area positioned on the inside of the gradient coil 3. In this situation, the X-axis, the Y-axis, and the Z-axis structure an apparatus coordinate system unique to the MRI apparatus 100. For example, the Z-axis coincides with the axis of the circular cylinder of the gradient coil 3 and is set so as to extend along a magnetic flux of the static magnetic field generated by the static magnetic field magnet 1. Further, the X-axis is set so as to extend along a horizontal direction orthogonal to the Z-axis. The Y-axis is set so as to extend along a vertical direction orthogonal to the Z-axis.

The gradient coil drive circuitry 5 is power supply circuitry configured, by supplying an electric current to the gradient coil 3, to generate the gradient magnetic fields along the axial directions of the X-, Y-, and Z-axes, within the space provided on the inside of the gradient coil 3. As a result of the gradient coil drive circuitry 5 generating the gradient magnetic fields extending along the axial directions of the X-, Y-, and Z-axes in this manner, it is possible to generate the gradient magnetic fields along a readout direction, a phase-encoding direction, and a slice direction, respectively.

In this situation, the axes extending along the readout direction, the phase-encoding direction, and the slice direction structure a logical coordinate system used for defining slice regions or a volume region serving as a target of an imaging data acquisition. In the following sections, the gradient magnetic field generated along the readout direction will be referred to as a readout gradient magnetic field. The gradient magnetic field generated along the phase-encoding direction will be referred to as a phase-encoding gradient magnetic field. The gradient magnetic field generated along the slice direction will be referred to as a slice gradient magnetic field.

More specifically, the gradient magnetic fields, namely the readout gradient magnetic field, the phase-encoding gradient magnetic field, and the slice gradient magnetic field, are superimposed on the static magnetic field generated by the static magnetic field magnet 1 and append spatial position information to Magnetic Resonance (MR) signals emitted from the subject 2. The readout gradient magnetic field appends position information along the readout direction to an MR signal, by varying the frequency of the MR signal in accordance with the position in the readout direction. The phase-encoding gradient magnetic field appends position information in the phase-encoding direction to an MR signal, by varying the phase of the MR signal along the phase-encoding direction. The slice gradient magnetic field appends position information along the slice direction to an MR signal. For example, when an imaging region is represented by slice regions, the slice gradient magnetic field is used for determining the orientations, the thicknesses, and the quantity of the slice regions. In contrast, when an imaging region is represented by a volume region, the slice gradient magnetic field is used for varying the phase of the MR signal in accordance with the position in the slice direction.

The couch 6 includes a couchtop on which the subject 2 is placed. When an imaging data acquisition is performed on the subject 2, the couchtop is moved so that the subject 2 is placed in the imaging area.

The transmitter circuitry 7 is configured to output a radio frequency pulse signal corresponding to a resonant frequency (a Larmor frequency) unique to a target atomic nucleus placed in the static magnetic field, to the transmitter coil 8. More specifically, the transmitter circuitry 7 includes a pulse generator, a radio frequency generator, a modulator, and a radio frequency amplifier. The pulse generator is configured to generate a waveform of the radio frequency pulse signal. The radio frequency generator is configured to generate a radio frequency signal having the resonant frequency. The modulator is configured to generate the radio frequency pulse signal by modulating the amplitude of the radio frequency signal generated by the radio frequency generator with the waveform generated by the pulse generator. The radio frequency amplifier is configured to amplify the radio frequency pulse signal generated by the modulator and output the amplified pulse signal to the transmitter coil 8.

The transmitter coil 8 is a radio frequency coil that is arranged on the inside of the gradient coil 3 and has a transmitting function of applying a radio frequency magnetic field to the imaging area in which the subject 2 is placed. More specifically, on the basis of the radio frequency pulse signal supplied from the transmitter circuitry 7, the transmitter coil 8 is configured to apply the radio frequency magnetic field to the imaging area positioned on the inside of the transmitter coil 8. In this situation, the transmitter coil 8 may further have, in addition to the transmitting function, a receiving function of receiving the MR signal emitted from the subject 2 due to the influence of the radio frequency magnetic field. In that situation, the transmitter coil 8 receives the MR signal emitted from the subject 2 due to the influence of the radio frequency magnetic field and outputs the received MR signal to the receiver circuitry 10. The transmitter coil 8 may be referred to as a Whole Body (WB) coil.

The receiver array coil 9 is a radio frequency coil having a receiving function of receiving the MR signal emitted from the subject 2. More specifically, the receiver array coil 9 is attached to the subject 2 arranged on the inside of the transmitter coil 8 and is configured to receive the MR signal emitted from the subject 2 due to the influence of the radio frequency magnetic field applied by the transmitter coil 8 and to output the received MR signal to the receiver circuitry 10. In this situation, as the receiver array coil 9, an exclusive-use coil for each of the sites of the subject 2 is prepared in advance, so as to use one of the coils appropriately selected in accordance with the site to be imaged.

The receiver circuitry 10 is configured to generate MR signal data on the basis of the MR signal output from either the transmitter coil 8 or the receiver array coil 9 and to output the generated MR signal data to the sequence control circuitry 4. More specifically, the receiver circuitry 10 includes a pre-amplifier, a detector, and an Analog/Digital (A/D) converter. The pre-amplifier is configured to amplify the MR signal output from either the transmitter coil 8 or the receiver array coil 9. The pre-amplifier is included in the receiver array coil 9 in many situations. The detector is configured to detect an analog signal obtained by subtracting the component of the resonant frequency from the MR signal amplified by the pre-amplifier. The A/D converter is configured to generate the MR signal data by converting the analog signal detected by the detector into a digital signal and to output the generated MR signal data to the sequence control circuitry 4.

In the present example, the configuration is explained in which the MRI apparatus 100 has a so-called tunnel-like structure where the static magnetic field magnet 1, the gradient coil 3, and the transmitter coil 8 are each formed to have a substantially circular cylindrical shape; however, possible embodiments are not limited to this example. For instance, the MRI apparatus 100 may have a so-called open structure where a pair of static magnetic field magnets, a pair of gradient coils, and a pair of RE coils are each arranged so as to face each other while the imaging area in which the subject 2 is placed is interposed therebetween.

The sequence control circuitry 4 is processing circuitry configured to execute various types of pulse sequences to acquire the MR signal data of the subject 2. More specifically, the sequence control circuitry 4 executes the various types of pulse sequences by driving the gradient coil drive circuitry 5, the transmitter circuitry 7, the receiver circuitry 10, and array coil drive circuitry on the basis of sequence execution data output from processing circuitry 12b of the computer 12. In this situation, the sequence execution data is information defining a pulse sequence. More specifically, the sequence execution data is information that defines: the timing with which the electric current is to be supplied by the gradient coil drive circuitry 5 to the gradient coil 3 and the intensity of the electric current to be supplied; the intensity of the RF pulse signal to be supplied by the transmitter circuitry 7 to the transmitter coil 8 and the timing with which the RF pulse signal is to be supplied; the detection timing with which the MR signals are to be detected by the receiver circuitry 10, and the like.

The data acquisition circuitry 11 is configured to acquire the MR signal data related to the subject 2. More specifically, as a result of the sequence control circuitry 4 executing any of the various types of pulse sequences, the data acquisition circuitry 11 is configured to receive the MR signal data output from the receiver circuitry 10 and to store the received MR signal data into a storage 12a of the computer 12. In this situation, a set made up of pieces of MR signal data received by the data acquisition circuitry 11 is stored in the storage 12a as data structuring a k-space, as a result of being arranged two-dimensionally or three-dimensionally according to the position information appended thereto by the readout gradient magnetic field, the phase-encoding gradient magnetic field, and the slice gradient magnetic field.

The computer 12 is configured to exercise overall control of the MRI apparatus 100. More specifically, the computer 12 includes the storage 12a and the processing circuitry 12b.

The storage 12a is configured to store various types of data therein. More specifically, the storage 12a stores therein the MR signal data and image data. For example, the storage 12a is realized by using a semiconductor memory element such as a Random Access memory (RAM) or a flash memory, or a hard disk, an optical disk, or the like.

The processing circuitry 12b is configured to exercise overall control of the MRI apparatus 100 by controlling constituent elements of the MRI apparatus 100 on the basis of input operations received by the interface 13. For example, the processing circuitry 12b includes an imaging controlling function and an image generating function.

The imaging controlling function is configured to receive an input of an imaging condition from an operator via the interface 13 and to generate the sequence execution data on the basis of the received imaging condition. Further, the imaging controlling function is configured to execute any of the various types of pulse sequences by transmitting the generated sequence execution data to the sequence control circuitry 4.

The image generating function is configured to generate an image on the basis of the MR signal data stored in the storage 12a. More specifically, the image generating function is configured to generate the image by reading the MR signal data stored in the storage 12a by the data acquisition circuitry 11 and performing a post-processing process, i.e., a reconstructing process such as a Fourier transform, on the read MR signal data. After that, the image generating function is configured to store the image data of the generated image into the storage 12a. Further, the image generating function is configured to read the image data from the storage 12a and to output the read image data to the display 14, in response to a request from the operator.

The interface 13 is configured to receive input operations of various instructions and various types of information from the operator. More specifically, the interface 13 is connected to the processing circuitry 12b of the computer 12 and is configured to convert the input operations received from the operator into electrical signals and to output the electrical signals to the processing circuitry 12b. For example, the interface 13 is realized by using a trackball, a switch button, a mouse, a keyboard, a touchpad on which an input operation can be performed by touching the operation surface thereof, a touch screen in which a display screen and a touchpad are integrally formed, and/or contactless input circuitry using an optical sensor, and audio input circuitry or the like that are used for setting imaging conditions, a Region of Interest (ROI), and the like. In the present disclosure, the interface 13 does not necessarily have to include one or more physical operational component parts such as a mouse, a keyboard, and/or the like. Examples of the interface 13 include, for instance, electrical signal processing circuitry configured to receive an electrical signal corresponding to an input operation from an external input device provided separately from the apparatus and to output the electrical signal to control circuitry.

The display 14 is configured to display various types of information and various types of images. More specifically, the display 14 is connected to the processing circuitry 12b of the computer 12 and is configured to convert data of the various types of information and the various types of images sent thereto from the processing circuitry 12b into display-purpose electrical signals and to output the electrical signals. For example, the display 14 is realized by using a liquid crystal monitor, a Cathode Ray Tube (CRT) monitor, a touch panel, or the like.

Among the constituent elements described above, the sequence control circuitry 4, the data acquisition circuitry 11, and the processing circuitry 12b of the computer 12 may be realized by using one or more processors, for example. In that situation, for example, the processing function of each of the pieces of processing circuitry is stored in the storage 12a in the form of a computer-executable program. Further, the pieces of processing circuitry realize the functions corresponding to the programs by reading and executing the programs from the storage 12a. In this situation, the pieces of processing circuitry may be configured by using a plurality of processors, so that the processors realize the processing functions by executing the programs. Alternatively, the processing functions of the pieces of processing circuitry may be realized as being distributed to a plurality of pieces of processing circuitry or as being integrated together into a single piece of processing circuitry, as appropriate. Further, in the above description, the example is explained in which the single storage (i.e., the storage 12a) is configured to store therein the programs corresponding to the processing functions; however, another arrangement is also acceptable in which a plurality of storages are provided in a distributed manner, so that the pieces of processing circuitry each read a corresponding one of the programs from a corresponding one of the individual storages.

An overall configuration of the MRI apparatus 100 according to the present embodiment has thus been explained. With this configuration, in the present embodiment, the aforementioned receiver array coil 9 is structured with the plurality of receiver coils. Further, each of the receiver coils included in the receiver array coil 9 includes a coil element and a tuning element used for tuning a tunable frequency of a receiving-purpose radio frequency coil to a desired frequency.

In this configuration, generally speaking, for the purpose of decoupling the receiver coils from the transmitter coil 8 at the time of transmitting when the transmitter coil 8 applies the radio frequency magnetic field and for the purpose of protecting the circuitry in the receiving system from an induced electromotive force exerted on the receiver coils by the radio frequency magnetic field, each of the receiver coils would be provided with a switching element that turns off the receiver coil at the time of transmitting and turns on the receiver coil at the time of receiving.

However, because the abovementioned switching element would usually be provided on the coil element of each of the receiver coils, the switching elements would cause a loss in the MR signals received by the receiver array coil 9 and, as a result, might become a factor that lowers the Signal-to-Noise (SN) ratio of the MR signals. Further, receiver coils would usually be each provided with more than one switching element in many situations. When a large number of switching elements are provided, the switching elements could be a factor that further lowers the SN ratio of the MR signals.

For this reason, the MRI apparatus 100 according to the present embodiment is configured to increase the SN ratio of the MR signals received by the receiver array coil 9, by eliminating the switching elements from the coil elements of the receiver coils. In the following sections, a configuration of the MRI apparatus 100 structured in this manner will be explained in detail.

Figure 2:
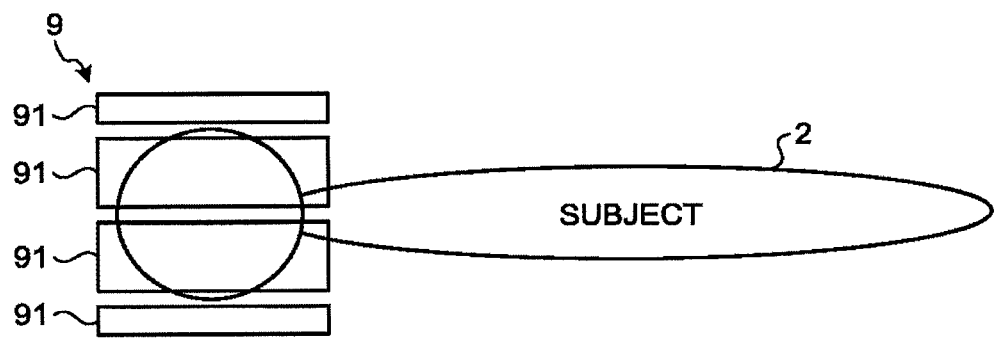
FIG. 2 is a drawing illustrating an exemplary configuration of a receiver array coil according to the first embodiment.
Figure 3:
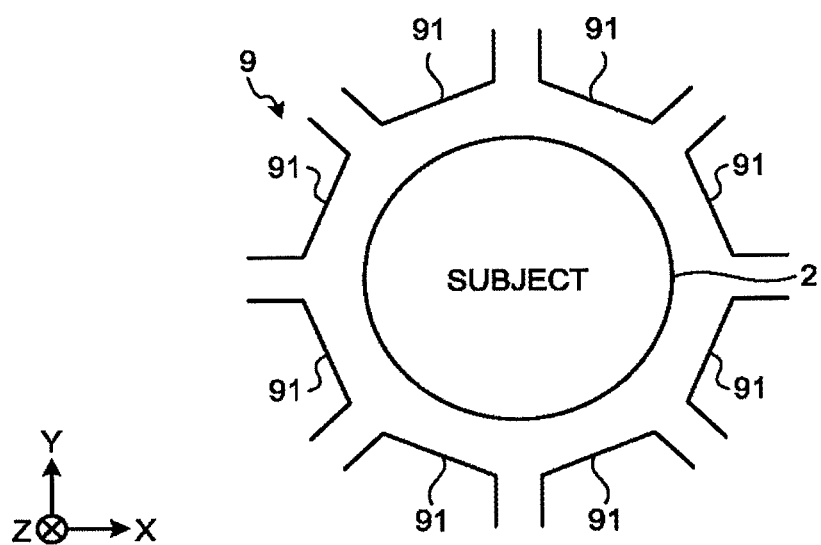
FIG. 3 is another drawing illustrating the exemplary configuration of the receiver array coil according to the first embodiment.

FIGS. 2 and 3 are drawings illustrating an exemplary configuration of the receiver array coil 9 according to the first embodiment.

FIGS. 2 and 3 illustrate an example in which the receiver array coil 9 is a coil for the head to be attached to the head of the subject 2.

For example, as illustrated in FIG. 2, the receiver array coil 9 is structured with a plurality of receiver coils 91. In this situation, the receiver coils 91 included in the receiver array coil 9 are arranged so as to face each other while the subject 2 is interposed therebetween, when the receiver array coil 9 is attached to the subject 2.

In the present example, for instance, as illustrated in FIG. 3, the receiver coils 91 are arranged, on an X-Y plane, so as to face one another while the subject 2 is interposed therebetween. Further, the receiver coils 91 are uniformly arranged along the circumferential direction on the X-Y plane, so as to uniformly cover the head of the subject 2.

Figure 4:
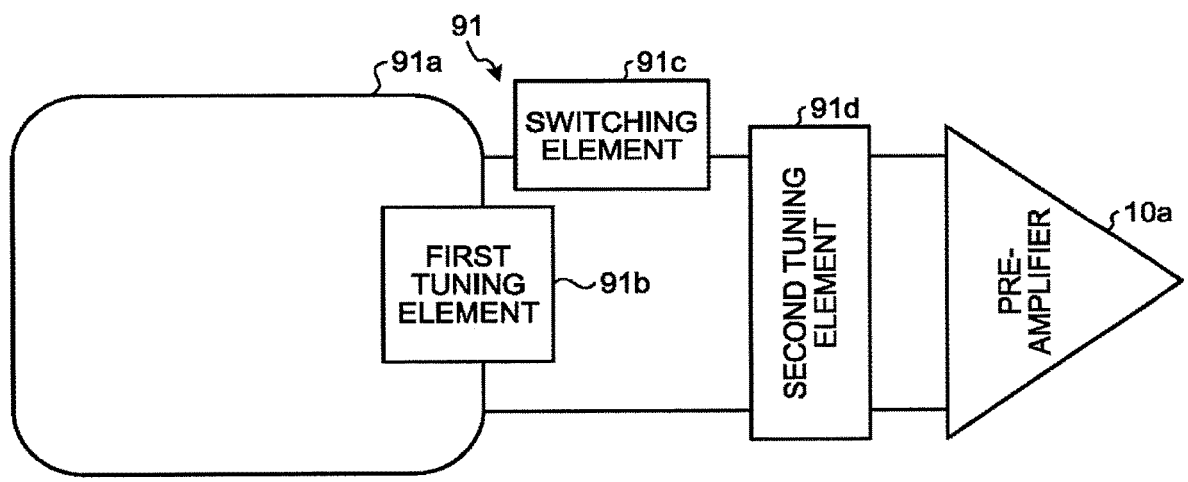
FIG. 4 is a diagram illustrating an exemplary configuration of each of receiver coils included in the receiver array coil according to the first embodiment.

FIG. 4 is a diagram illustrating an exemplary configuration of each of the receiver coils 91 included in the receiver array coil 9 according to the first embodiment.

For example, as illustrated in FIG. 4, each of the receiver coils 91 included in the receiver array coil 9 includes: a coil element 91a, a first tuning element 91b, and a series circuit including a switching element 91c and a second tuning element 91d.

The first tuning element 91b is configured to tune the tunable frequency of the receiver coil 91 to a desired frequency. More specifically, the first tuning element 91b is connected in series with the coil element 91a and structures a resonant circuit together with the coil element 91a.

The series circuit including the switching element 91c and the second tuning element 91d is connected in parallel with the first tuning element 91b. Further, with the second tuning element 91d, a pre-amplifier 10a included in the receiver circuitry 10 is connected in parallel.

As explained above, in the present embodiment, the coil element 91a of each of the receiver coils 91 includes no switching element. Consequently, according to the present embodiment, it is possible to reduce the loss of the MR signals and to increase the SN ratio of the MR signals received by the receiver array coil 9.

In the configuration described above in which switching elements are excluded from the coil elements 91a of the receiver coils 91, because the receiver coils 91 are not turned off at the time of transmitting, it means that the transmitter coil 8 can be coupled with the receiver coils 91. For this reason, for example, when the tunable frequency of each of the receiver coils 91 is tuned to the resonant frequency, an excessive amount of radio frequency current would flow in the receiver coil 91 at the time of transmitting. As a result, it is expected that the distribution of the radio frequency magnetic field in the subject 2 might become non-uniform.

Figure 5:
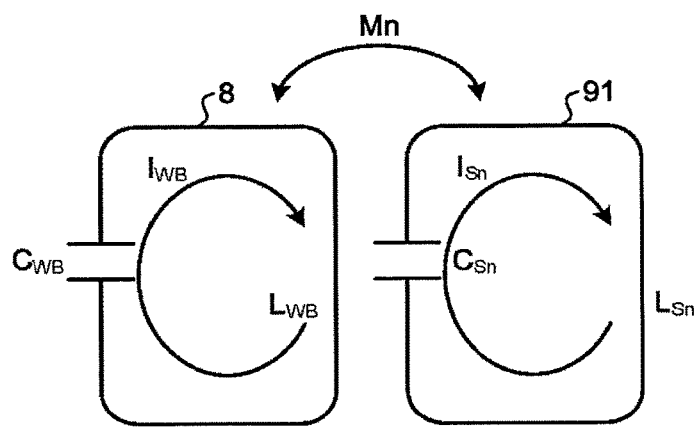
FIG. 5 is a conceptual diagram of coupling between a transmitter coil and any of the receiver coils according to the first embodiment.
Figure 6:
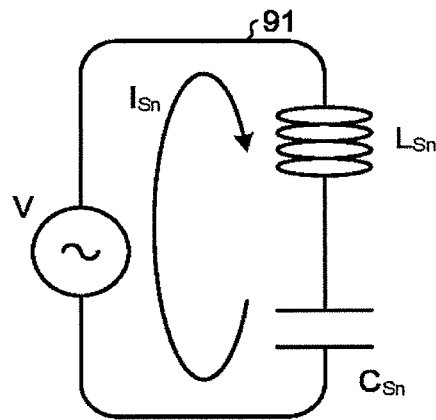
FIG. 6 is another conceptual diagram of the coupling between the transmitter coil and any of the receiver coils according to the first embodiment.

FIGS. 5 and 6 are conceptual diagrams of the coupling between the transmitter coil 8 and any of the receiver coils 91 according to the first embodiment.

For example, as illustrated in FIG. 5, $M_n$ denotes a coupling coefficient between the transmitter coil 8 and the receiver coil 91. Further, $L_{WB}$ denotes the inductance of a coil element included in the transmitter coil 8, whereas $C_{WB}$ denotes the capacitance of the tuning element, while $I_{WB}$ denotes the electric current (hereinafter "current") flowing in the transmitter coil 8. Further, $L_{Sn}$ denotes the inductance of the coil element included in the receiver coil 91, whereas $C_{Sn}$ denotes the capacitance of the tuning element, while $I_{Sn}$ denotes the current flowing in the receiver coil 91.

In this situation, it is possible to express the frequency (i.e., the resonant frequency $\omega_0$) of the radio frequency magnetic field applied by the transmitter coil 8, by using expression (1) presented below:

$$\omega_0 = \frac{1}{\sqrt{L_{WB} \cdot C_{WB}}} \tag{1}$$

Further, it is possible to express the tunable frequency $\omega_s$ of the receiver coil 91 by using Expression (2) presented below:

$$\omega_s = \frac{1}{\sqrt{L_{Sn} \cdot C_{Sn}}} \tag{2}$$

Further, for example, as illustrated in FIG. 6, V denotes induced electromotive force exerted on the receiver coil 91 when the radio frequency magnetic field occurring from the transmitter coil 8 is interlinked with the receiver coil 91.

In that situation, it is possible to express the induced electromotive force V by using Expression (3) presented below, where $\omega$ denotes the frequency of the radio frequency magnetic field interlinked with the receiver coil 91.

$$V = -iM_n\omega 1_{WB} = i\left(L_{Sn}\omega - \frac{1}{C_{Sn}\omega}\right)I_{Sn} \quad (3)$$

In this situation, as explained above, for example, when the tunable frequency $\omega_s$ of the receiver coil 91 is tuned to the resonant frequency $\omega_0$ ($\omega = \omega_s$), the value of the term of the impedance ($L_{Sn}\omega - (1/C_{Sn}\omega)$) in Expression (3) becomes extremely small, which makes the current $I_{Sn}$ flowing in the receiver coil 91 extremely large. As a result, the distribution of the radio frequency magnetic field in the subject 2 becomes non-uniform.

In contrast, when the tunable frequency $\omega_s$ of the receiver coil 91 is arranged to be higher than the resonant frequency $\omega_0$ ($\omega < \omega_s$), the sign of the current $I_{WB}$ flowing in the transmitter coil 8 becomes the same as the sign of the current $I_{Sn}$ flowing in the receiver coil 91 on the basis of the relationship in Expression (3). In other words, in that situation, in the receiver coil 91, the current $I_{Sn}$ flows in the forward direction with respect to the current $I_{WB}$ flowing in the transmitter coil 8.

Accordingly, in the receiver array coil 9 according to the present embodiment, the switching element 91c included in each of the receiver coils 91 is configured to adjust the tunable frequency $\omega_s$ of the receiver coil 91 to a frequency higher than the resonant frequency $\omega_0$ ($\omega_0 < \omega_s$) at the time of transmitting and is configured to adjust the tunable frequency $\omega_s$ of the receiver coil 91 to the frequency equal to the resonant frequency $\omega_0$ ($\omega_0 = \omega_s$) at the time of receiving.

More specifically, the first tuning element 91b is configured to tune the tunable frequency of the receiver coil 91 to the frequency higher than the resonant frequency $\omega_0$. Further, when being connected to the first tuning element 91b, the second tuning element 91d is configured to arrange the tunable frequency of the receiver coil 91 to be tuned to the resonant frequency $\omega_0$. Further, the switching element 91c is configured to disconnect the first tuning element 91b and the second tuning element 91d from each other at the time of transmitting and is configured to arrange the first tuning element 91b and the second tuning element 91d to be electrically conductive with each other at the time of receiving.

With these arrangements, at the time of transmitting, in each of the receiver coils 91, the current $I_{Sn}$ flows in the forward direction with respect to the current $I_{WB}$ flowing in the transmitter coil 8. In this situation, it is possible to adjust the magnitude of the current $I_{Sn}$ flowing in each of the receiver coils 91 by setting the tunable frequency $\omega_s$ of the receiver coil 91 at an appropriate level.

As explained above, in each of the receiver coils 91, the current $I_{Sn}$ flows in the forward direction with respect to the current $I_{WB}$ flowing in the transmitter coil 8 and thereby generates, in the surroundings of the receiver coil 91, a radio frequency magnetic field that strengthens the radio frequency magnetic field generated by the transmitter coil 8. As a result, in the present embodiment, even when the electric power supplied to the transmitter coil 8 is reduced, it is possible to generate a sufficient radio frequency magnetic field for inducing the magnetic resonance signals. In other words, according to the present embodiment, it is possible to improve transmitting efficiency of the transmitter coil 8.

In this situation, the radio frequency magnetic fields generated in a reinforcement manner by the receiver coils 91 as described above are locally generated in the surroundings of the positions where the receiver coils 91 are arranged; however, in the present embodiment, the receiver coils 91 are arranged so as to uniformly cover the subject 2 along the circumferential direction on the X-Y plane, as illustrated in FIGS. 2 and 3. For this reason, according to the present embodiment, it is possible to uniformly generate the radio frequency magnetic field on the X-Y plane.

Figure 7:
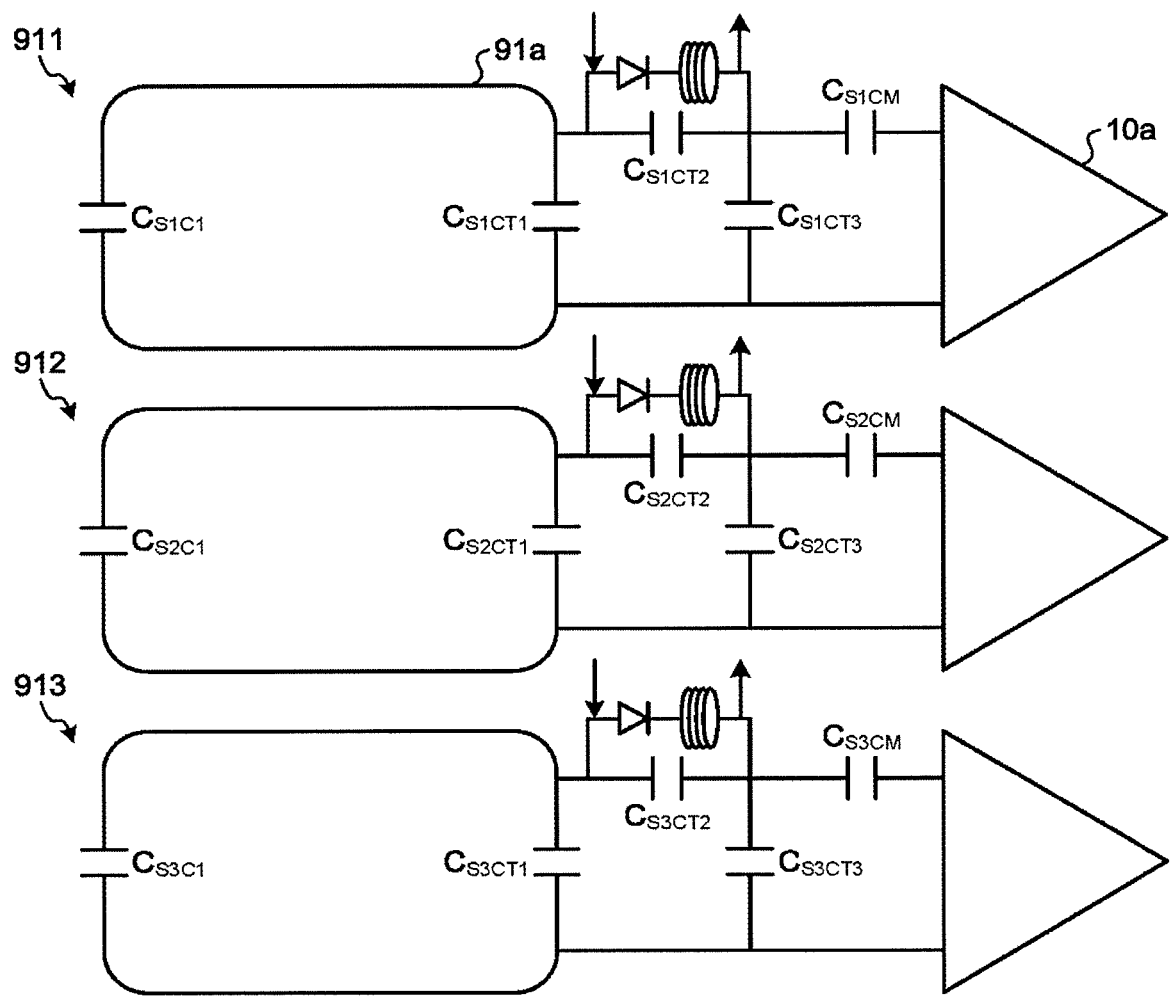
FIG. 7 is a diagram illustrating a specific exemplary configuration of the receiver coils included in the receiver array coil according to the first embodiment.

FIG. 7 is a diagram illustrating a specific exemplary configuration of the receiver coils 91 included in the receiver array coil 9 according to the first embodiment.

For example, as illustrated in FIG. 7, the receiver array coil 9 includes a first receiver coil 911, a second receiver coil 912, and a third receiver coil 913. Because the first receiver coil 911, the second receiver coil 912, and the third receiver coil 913 have the same configuration as one another, the first receiver coil 911 will be used as an example in the following explanations. Further, although the three receiver coils are illustrated in the example, the number of receiver coils included in the receiver array coil 9 may be smaller than three or larger than three.

For example, as illustrated in FIG. 7, as the first tuning element explained above, the first receiver coil 911 includes a first capacitor $C_{S1C1}$ and a second capacitor $C_{S1CT1}$. In this situation, the first capacitor $C_{S1C1}$ and the second capacitor $C_{S1CT1}$ are each connected in series with the coil element 91a.

Further, as the switching element explained above, the first receiver coil 911 includes a third capacitor $C_{S1CT2}$ and a series circuit including a pin diode and an inductor and being connected in parallel with the third capacitor $C_{S1CT2}$.

Further, as the second tuning element explaining above, the first receiver coil 911 includes a fourth capacitor $C_{S1CT3}$ and a fifth capacitor $C_{S1CM}$ connected in series with the fourth capacitor $C_{S1CT3}$. In this situation, the fourth capacitor $C_{S1CT3}$ is connected in parallel with the first capacitor $C_{S1C1}$ and the second capacitor $C_{S1CT1}$ via the switching element. Further, the fourth capacitor $C_{S1TC3}$ is connected in parallel with the pre-amplifier 10a of the receiver circuitry 10. Between the fourth capacitor $C_{S1CT3}$ and the pre-amplifier 10a, a fifth capacitor $C_{S1CM}$ is inserted in series. In this situation, as for the transmitting path on the input side of the pre-amplifier 10a, the characteristic impedance needs to match with 50Ω. For this reason, the fifth capacitor $C_{S1CM}$ is set with such a capacitance that arranges the characteristic impedance of the transmitting path on the input side of the pre-amplifier 10a to match with 50Ω.

In this configuration, the first capacitor $C_{S1C1}$ and the second capacitor $C_{S1CT1}$ are each set with such a capacitance that arranges the tunable frequency $\omega_s$ of the first receiver coil 911 to be tuned to a frequency higher than the resonant frequency $\omega_0$. Further, the third capacitor $C_{S1CT2}$ and the fourth capacitor $C_{S1CT3}$ are each set with such a capacitance that, when being connected to the first capacitor $C_{S1C1}$ and the second capacitor $C_{S1CT1}$, arranges the tunable frequency $\omega_s$ of the first receiver coil 911 to be tuned to the frequency equal to the resonant frequency $\omega_0$.

Further, at the time of transmitting, as a result of the sequence control circuitry 4 causing a drive current (indicated with an arrow in FIG. 7) to flow in the pin diode in the switching element, the inductor and the third capacitor $C_{S1CT2}$ of the switching element are tuned to a desired frequency so as to increase the impedance of the switching element. As a result, the first capacitor $C_{S1C1}$ and the second capacitor $C_{S1CT1}$ are disconnected from the third capacitor $C_{S1CT2}$ and the fourth capacitor $C_{S1CT3}$. As a result, at the time of transmitting, the tunable frequency $\omega_s$ of the receiver coil 91 is adjusted to a frequency higher than the resonant frequency $\omega_0$.

In contrast, at the time of receiving, as a result of the sequence control circuitry 4 stopping the supply of the drive current to the pin diode, a current is arranged to flow in the third capacitor $C_{S1CT2}$. As a result, the first capacitor $C_{S1C1}$ and the second capacitor $C_{S1CT1}$ are electrically conductive with the third capacitor $C_{S1CT2}$ and the fourth capacitor $C_{S1CT3}$, so that the third capacitor $C_{S1CT2}$ and the fourth capacitor $C_{S1CT3}$ are connected to the first capacitor $C_{S1C1}$ and the second capacitor $C_{S1CT1}$. Consequently, at the time of receiving, the tunable frequency $\omega_s$ of the receiver coil 91 is adjusted to the frequency equal to the resonant frequency $\omega_0$.

In the example illustrated in FIG. 7, by using the fifth capacitor $C_{S1CM}$, the characteristic impedance of the transmitting path on the input side of the pre-amplifier 10a is arranged to match 50Ω. However, possible embodiments are not limited to this example. For instance, instead of using the fifth capacitor $C_{S1CM}$, it is also acceptable to arrange the characteristic impedance of the transmitting path on the input side of the pre-amplifier 10a to match 50Ω, by adjusting the balance between the capacitances of the third capacitor $C_{S1CT2}$ and the fourth capacitor $C_{S1CT3}$.

The configurations of the receiver coils 91 included in the receiver array coil 9 according to the present embodiment have thus been explained. Further, in the present embodiment, at least two receiver coils 91 positioned adjacent to each other among the plurality of receiver coils 91 are decoupled from each other.

Figure 8:
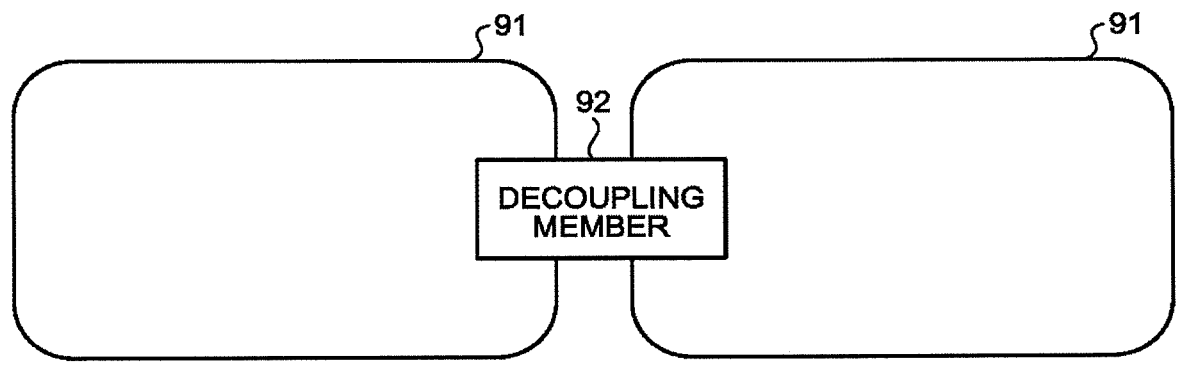
FIG. 8 is a diagram illustrating decoupling of receiver coils in the receiver array coil according to the first embodiment.

FIG. 8 is a diagram illustrating the decoupling of the receiver coils 91 in the receiver array coil 9 according to the first embodiment.

For example, as illustrated in FIG. 8, in the receiver array coil 9 according to the present embodiment, at least two receiver coils 91 positioned adjacent to each other among the plurality of receiver coils 91 are decoupled from each other by a decoupling member 92.

As an example of the decoupling member 92, generally speaking, the adjacently-positioned coils are arranged to partially overlap with each other, in an array coil structured with a plurality of coils like the receiver array coil 9 according to the present embodiment. However, when the receiver coils 91 are configured to generate radio frequency magnetic fields in a reinforcement manner like in the present embodiment, the radio frequency magnetic field would be emphasized by the two coils in the overlapping part of the receiver coils 91. As a result, it is expected that there might be a region where the distribution of the radio frequency magnetic field would locally become non-uniform.

To cope with this situation, in the present embodiment, at least two receiver coils 91 positioned adjacent to each other among the plurality of receiver coils 91 are decoupled from each other, by being arranged to partially overlap with each other, while it is ensured that the directions of the radio frequency magnetic fields occurring in the overlapping part thereof do not affect the distribution of the radio frequency magnetic field formed inside the subject 2.

More specifically, in the present embodiment, at least two receiver coils 91 positioned adjacent to each other among the plurality of receiver coils 91 are configured in such a manner that the radio frequency magnetic field occurring from the overlapping part avoids an imaging region inside the subject 2.

Figure 9:
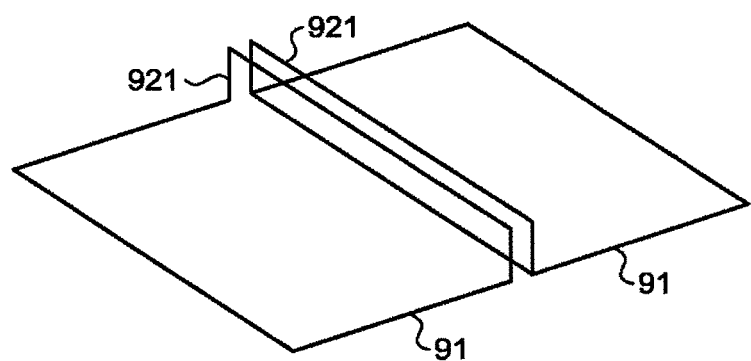
FIG. 9 is a drawing illustrating an example of a decoupling member for the receiver array coil according to the first embodiment.
Figure 10:
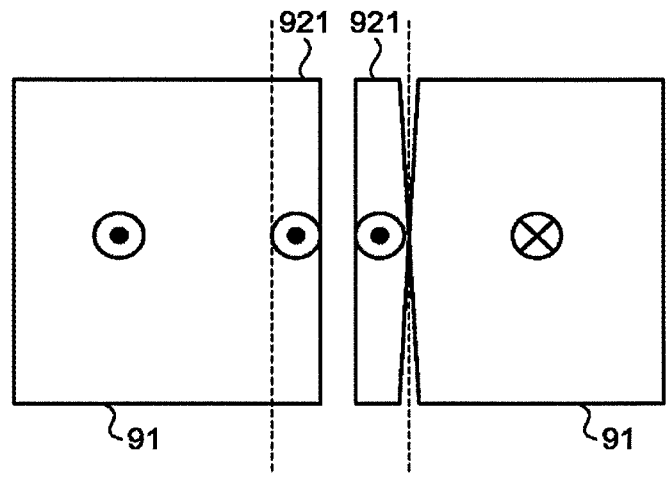
FIG. 10 is a drawing illustrating another example of the decoupling member for the receiver array coil according to the first embodiment.

FIGS. 9 and 10 are drawings illustrating examples of the decoupling member 92 for the receiver array coil 9 according to the first embodiment.

For example, as illustrated in FIGS. 9 and 10, with respect to each of the receiver coils 91 positioned adjacent to each other, an overlapping part 921 thereof is formed so as to be substantially orthogonal to the plane of the coil. The broken lines in FIG. 10 each indicate the position at which the overlapping part 921 of each of the receiver coils 91 is bent in the direction substantially orthogonal to the plane of the coil.

In this situation, for example, as illustrated in FIGS. 9 and 10, the overlapping part 921 of one of the receiver coils 91 (the receiver coil 91 illustrated on the right-hand side of FIGS. 9 and 10) is formed so as to face the overlapping part 921 of the other receiver coil 91 (the receiver coil 91 illustrated on the left-hand side of FIGS. 9 and 10) while being inverted by 180 degrees.

With this arrangement, from the overlapping part 921 of each of the receiver coils 91, a radio frequency magnetic field occurs in the direction parallel to the plane of the coil. Accordingly, it is possible to generate the radio frequency magnetic fields so as to avoid the imaging region inside the subject 2. In FIG. 10, the circles each having a dot inside and the circle having a cross inside indicate the directions of the radio frequency magnetic fields interlinked with the receiver coils 91.

As explained above, according to the present embodiment, the receiver coils 91 positioned adjacent to each other are arranged so as to partially overlap with each other, while it is ensured that the directions of the radio frequency magnetic fields occurring in the overlapping part thereof do not affect the distribution of the radio frequency magnetic field inside the subject 2. As a result, it is possible to uniformly generate the radio frequency magnetic field in the imaging region inside subject 2, while arranging the receiver coils 91 positioned adjacent to each other to be decoupled from each other.

As explained above, according to the first embodiment, by eliminating the switching elements from the coil elements of the receiver coils 91, it is possible to reduce the loss of the MR signals. It is therefore possible to increase the SN ratio of the MR signals received by the receiver array coil 9. Accordingly, it is possible to improve the quality of the image generated from the MR signals.

Further, according to the first embodiment, at the time of transmitting, the receiver coils 91 included in the receiver array coil 9 are able to generate the radio frequency magnetic fields in a reinforcement manner. Accordingly, it is possible to improve transmitting efficiency of the transmitter coil 8.

Second Embodiment

The first embodiment described above may also be carried out by modifying a part of the receiver array coil 9 as appropriate. Accordingly, in the following sections, a number of modification examples of the first embodiment will be explained as the second embodiment. The second embodiment will be explained while a focus is placed on differences from the first embodiment. Explanations of certain configurations that are the same as those in the first embodiment will be omitted.

For instance, in the first embodiment above, the example is explained (see FIGS. 9 and 10) in which, as an example of the decoupling member 92, the overlapping parts 921 of the receiver coils 91 positioned adjacent to each other are formed so as to be substantially orthogonal to the plane of the coil; however, possible embodiments are not limited to this example.

Figure 11:
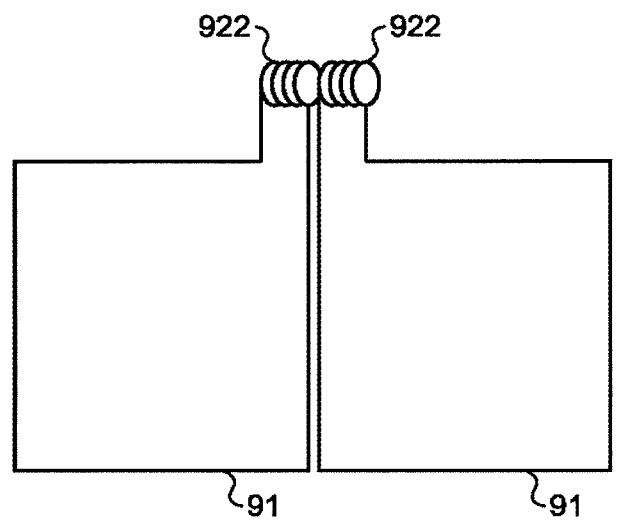
FIG. 11 is a drawing illustrating an example of a decoupling member for a receiver array coil according to a second embodiment.

FIG. 11 is a drawing illustrating an example of the decoupling member 92 for the receiver array coil 9 according to the second embodiment.

For example, as illustrated in FIG. 11, another arrangement is also acceptable in which an overlapping part 922 of each of the receiver coils 91 positioned adjacent to each other is reduced in size so that the overlapping parts 922 are placed on top of each other in positions distant from the receiver coils 91. In that situation, the overlapping parts 922 are arranged so that the directions of the radio frequency magnetic fields occurring therefrom are each parallel to the plane of the coil.

In another example, it is also acceptable to arrange the receiver coils 91 positioned adjacent to each other to be decoupled from each other by using an element different from the receiver coils 91.

Figure 12:
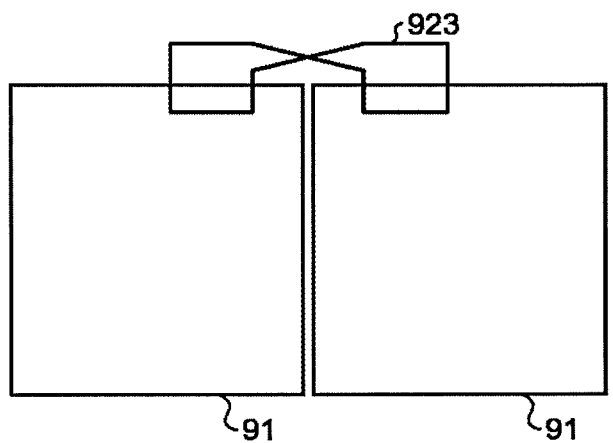
FIG. 12 is a drawing illustrating another example of the decoupling member for the receiver array coil according to the second embodiment.

FIG. 12 is a drawing illustrating the other example of the decoupling member 92 for the receiver array coil 9 according to the second embodiment.

For example, as illustrated in FIG. 12, the receiver coils 91 positioned adjacent to each other are decoupled from each other by using a figure-8 coil 923 having two loops inverted from each other by 180 degrees. In that situation, the figure-8 coil 923 is arranged in such a manner that one of the two loops partially overlaps with one of the adjacently-positioned receiver coils 91, while a part of the other loop partially overlaps with the other receiver coil 91.

In this situation, because the figure-8 coil 923 has a structure in which the two loops are connected in the opposite direction, the figure-8 coil is structured to be intrinsically decoupled from the radio frequency magnetic field applied by the transmitter coil 8. For this reason, the figure-8 coil 923 does not affect the distribution of the radio frequency magnetic fields generated by the receiver coils 91.

Further, in the first embodiment above, the example is explained (see FIG. 3) in which the receiver array coil 9 is a coil for the head; however, possible embodiments are not limited to this example. Generally speaking, many coils used for the head have a perfectly circular cross-section orthogonal to the axial direction. However, the receiver array coil 9 may have an oval cross-section orthogonal to the axial direction, like a coil used for the abdomen, for example.

Figure 13:
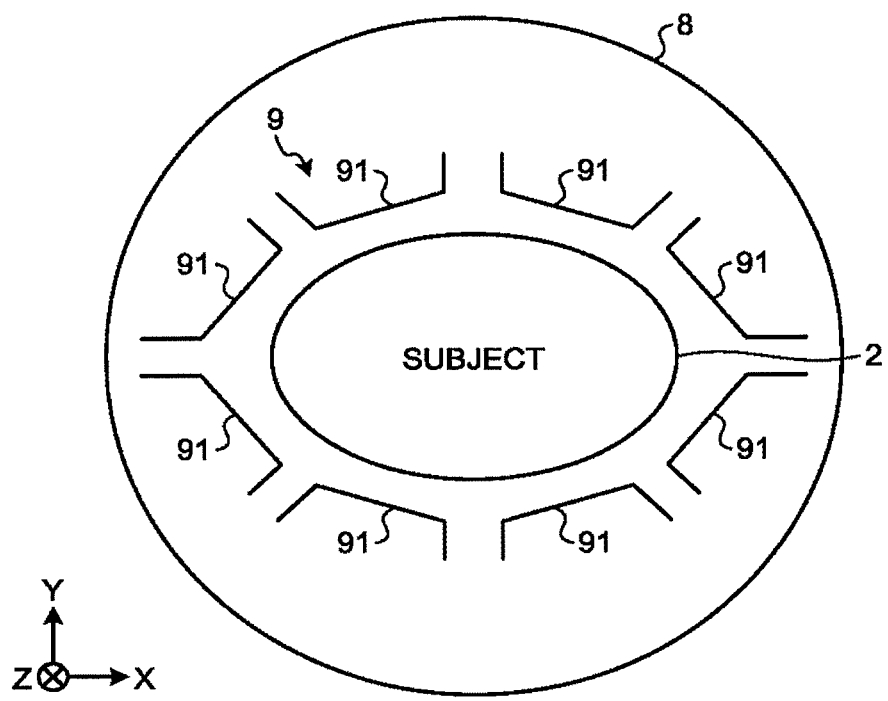
FIG. 13 is a drawing illustrating an example of a positional arrangement of the receiver coils in the receiver array coil according to the second embodiment.

FIG. 13 is a drawing illustrating an example of a positional arrangement of the receiver coils 91 in the receiver array coil 9 according to the second embodiment.

For example, as illustrated in FIG. 13, when the receiver array coil 9 has an oval cross-section orthogonal to the axial direction, the receiver coils 91 are arranged along the oval on the X-Y plane. In that situation also, the receiver coils 91 are uniformly arranged along the circumferential direction so as to uniformly cover the site of the subject 2 subject to the imaging data acquisition. As a result, it is possible to achieve the same advantageous effects as those achieved in the first embodiment.

In this situation, the plurality of receiver coils 91 arranged along the circumferential direction may each be housed in a coil case. Alternatively, when the receiver array coil 9 is structured with a plurality of coil cases that can be separated, the receiver coils 91 may be housed separately in the plurality of coil cases.

Further, the receiver coils 91 do not necessarily have to be arranged over the entire circumference. It is sufficient when at least a pair of receiver coils 91 is arranged to face each other while the subject 2 is interposed therebetween.

Further, the receiver array coil 9 does not necessarily have to be a coil for the head or a coil for the abdomen, as described above, and may be a coil for a knee, a coil for an arm, or coil for a foot, for example.

The term "processor" used in the above explanations denotes, for example, a Central Processing Unit (CPU), a Graphics Processing Unit (GPU), or a circuit such as an Application Specific Integrated Circuit (ASIC) or a programmable logic device (e.g., a Simple Programmable Logic Device [SPLD], a Complex Programmable Logic Device [CPLD], or a Field Programmable Gate Array [FPGA]). In this situation, instead of saving the programs in a storage, it is also acceptable to directly incorporate the programs in the circuits of the processors. In that situation, the processors realize the functions thereof by reading and executing the programs incorporated in the circuits thereof. Further, the processors in the present embodiments do not each necessarily have to be structured as a single circuit. It is also acceptable to structure one processor by combining together a plurality of independent circuits so as to realize the functions thereof. Further, it is also acceptable to integrate two or more of the constituent elements in FIG. 1 into one processor so as to realize the functions thereof.

In this situation, the programs executed by the processors are provided as being incorporated, in advance, into a Read-Only Memory (ROM) or a storage, for example. Alternatively, the programs may be provided as being recorded on a computer-readable storage medium such as a Compact Disk Read-Only Memory (CD-ROM), a flexible disk (FD), a Compact Disk Recordable (CD-R), a Digital Versatile Disk (DVD), or the like, in a file in such a format that is either installable or executable for the devices. Further, the programs may be stored in a computer connected to a network such as the Internet, so as to be provided or distributed as being downloaded via the network. For example, the programs are structured with modules including the functional units described above. In the actual hardware, as a result of a CPU reading and executing the programs from a storage medium such as a ROM, the modules are loaded into a main storage device so as to be generated in the main storage device.

According to at least one aspect of the embodiments described above, it is possible to increase the SN ratio of the magnetic resonance signals received by the receiver array coil.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising: a receiver array coil structured with a plurality of receiver coils, wherein
    each of the receiver coils included in the receiver array coil includes a coil element, a first tuning element configured to tune a tunable frequency of the receiver coil to a desired frequency, and a series circuit including a switching element and a second tuning element and being connected in parallel with the first tuning element,
    the switching element is configured to disconnect the first tuning element and the second tuning element from each other at a time of transmitting and is configured to arrange the first tuning element and the second tuning element to be electrically conductive with each other at a time of receiving, and at least two receiver coils positioned adjacent to each other among the plurality of receiver coils are decoupled from each other.

2. The magnetic resonance imaging apparatus according to claim 1, further comprising: a pre-amplifier configured to amplify a magnetic resonance signal received by the receiver coils, wherein the pre-amplifier is connected in parallel with the second tuning element.

3. The magnetic resonance imaging apparatus according to claim 1, wherein said at least two receiver coils positioned adjacent to each other are decoupled from each other, by being arranged to partially overlap with each other, while it is ensured that a direction of a radio frequency magnetic field occurring in an overlapping part thereof does not affect a distribution of a radio frequency magnetic field formed inside an examined subject.

4. The magnetic resonance imaging apparatus according to claim 1, wherein each of the receiver coils includes, as the switching element, a capacitor and a series circuit including a pin diode and an inductor and being connected in parallel with the capacitor.

5. The magnetic resonance imaging apparatus according to claim 1, wherein the receiver coils included in the receiver array coil are arranged so as to face each other while an examined subject is interposed therebetween, when the receiver array coil is attached to the examined subject.

6. A magnetic resonance imaging apparatus comprising a receiver array coil structured with a plurality of receiver coils, wherein each of the receiver coils included in the receiver array coil includes a switching element configured to adjust a tunable frequency of the receiver coil, and the switching element is configured to adjust the tunable frequency of the receiver coil to a frequency higher than a resonant frequency at a time of transmitting and is configured to adjust the tunable frequency of the receiver coil to a frequency equal to the resonant frequency at a time of receiving.

* * * * *